(12) United States Patent
Greve

(10) Patent No.: US 11,095,027 B2
(45) Date of Patent: Aug. 17, 2021

(54) COMPRESSED CLOSED CIRCUIT CIRCULARLY POLARIZED OMNI-DIRECTIONAL ANTENNA

(71) Applicant: Charles A. Greve, Amherst, VA (US)

(72) Inventor: Charles A. Greve, Amherst, VA (US)

(73) Assignee: VIDEO AERIAL SYSTEMS, LLC, Madison Heights, VA (US)

(*) Notice: Subject to any disclaimer, the term of this patent is extended or adjusted under 35 U.S.C. 154(b) by 0 days.

(21) Appl. No.: 16/134,961

(22) Filed: Sep. 18, 2018

(65) Prior Publication Data

US 2020/0335865 A1   Oct. 22, 2020

(51) Int. Cl.
| | |
|---|---|
| *H01Q 7/00* | (2006.01) |
| *H01Q 1/50* | (2006.01) |
| *H01P 3/08* | (2006.01) |
| *H05K 1/02* | (2006.01) |
| *H01Q 1/28* | (2006.01) |
| *H01Q 1/22* | (2006.01) |

(52) U.S. Cl.
CPC ............. *H01Q 1/50* (2013.01); *H01P 3/081* (2013.01); *H01Q 1/2291* (2013.01); *H01Q 1/28* (2013.01); *H01Q 1/285* (2013.01); *H01Q 7/00* (2013.01); *H05K 1/0243* (2013.01); *H05K 2201/10098* (2013.01)

(58) Field of Classification Search
CPC ............ H01Q 1/50; H01Q 1/241; H01Q 1/38; H01Q 1/2291; H01Q 21/26; H01Q 9/065; H01Q 7/00; H01Q 1/28; H01Q 1/285; H01P 3/081; H01P 5/12; H05K 1/0243; H05K 2201/10098
See application file for complete search history.

(56) References Cited

U.S. PATENT DOCUMENTS

| | | | |
|---|---|---|---|
| 2011/0102281 A1* | 5/2011 | Su ............................ | H01Q 7/00 343/742 |
| 2014/0306845 A1* | 10/2014 | Shiu ........................ | H01Q 1/38 343/700 MS |
| 2017/0346194 A1* | 11/2017 | Chamberland .......... | H01Q 1/38 |

* cited by examiner

*Primary Examiner* — Awat M Salih
(74) *Attorney, Agent, or Firm* — Rupak Nag

(57) ABSTRACT

Compressed closed circuit circularly polarized (CLCP) omni-directional antennas and methods of fabrication are described. Such an antenna reduces the size of conventional circularly polarized antennas while also allowing increased axial ratio. An antenna comprises a plurality of conductive elements at an angle of between 5 and 52 degrees spaced radially around a multi-element feed system. The multi-element feed system may be made from a PCB and fed from a coaxial cable. The plurality of conductive elements may contain between 2 and 8 individual conductive elements. Each element in the plurality of conductive elements is a closed loop. The antenna may be covered by a protective housing which may also further reduce the size of the antenna.

12 Claims, 17 Drawing Sheets

COMPRESSED CLOSED CIRCUIT CIRCULARLY POLARIZED OMNI-DIRECTIONAL ANTENNA

TECHNICAL FIELD

The present disclosure relates generally to antenna systems, and more specifically to circularly polarized omnidirectional antennas for use in video piloting, drone vehicles (aircraft and ground), mesh networking, and Wi-Fi applications.

BACKGROUND

Antennas are electrical devices which convert electric power into radio waves, and vice versa. They are usually used with a radio transmitter or radio receiver. In transmission, a radio transmitter supplies an electric current to the antenna's terminals, and the antenna radiates the energy from the current as electromagnetic waves (radio waves). In reception, an antenna intercepts some of the power of an electromagnetic wave in order to produce an electric current at its terminals, and is applied to a receiver to be amplified.

Typically an antenna consists of an arrangement of metallic conductors (elements), electrically connected (often through a transmission line) to the receiver or transmitter. Antennas may also include additional elements or surfaces with no electrical connection to the transmitter or receiver, such as parasitic elements, parabolic reflectors or horns, which serve to direct the radio waves into a beam or other desired radiation pattern.

Antennas can be designed to transmit and receive radio waves in all horizontal directions equally (omnidirectional antennas), or preferentially in a particular direction (directional or high gain antennas). An omnidirectional antenna is a class of antenna which radiates radio wave power uniformly in all directions in one plane, with the radiated power decreasing with elevation angle above or below the plane, dropping to zero on the antenna's axis. Omnidirectional antennas oriented vertically are widely used for nondirectional antennas on the surface of the Earth because they radiate equally in all horizontal directions, while the power radiated drops off with elevation angle so little radio energy is aimed into the sky or down toward the earth and wasted. Omnidirectional antennas are widely used for radio broadcasting antennas, and in mobile devices that use radio such as cell phones, FM radios, walkie-talkies, wireless computer networks, cordless phones, GPS as well as for base stations that communicate with mobile radios, such as police and taxi dispatchers and aircraft communications.

Typically omnidirectional circularly polarized antennas are much larger than linearly polarized antennas of the same frequency. Therefore, reducing their size to fit smaller devices such as WiFi systems or unmanned aerial vehicles is often desirable.

Various types of circularly polarized antennas have been developed. One is described in U.S. Pat. No. 3,656,166 titled "Broadband circularly polarized omnidirectional antenna" utilizing a plurality of passive elements surrounding a biconical dipole. It would be beneficial to not have to utilize a central dipole.

Another form of circularly polarized omnidirectional antennas may be found in Korean Patent KR101315546B1 titled "Dual-band omnidirectional circularly polarized wave antenna using metamaterial" which utilizes flat PCBs or stamped material to achieve an omni-directional circular pattern. It would be beneficial if the radiating elements in an antenna are turned upward and do not lay flat on a single plane.

Other forms of compressed circularly polarized omnidirectional antennas may be found in U.S. Published Patent App. 2017/0346194 titled "Compact Polarized omnidirectional helical antenna" in which an antenna has dipoles curved around a central axis fed by a micro-strip made from PCB material. It would be beneficial to have an antenna where the elements are closed-loop conductive elements and not open type dipoles. The closed loop elements allow for fewer electrical connections as well as allow a smaller form factor for the antenna.

SUMMARY

Provided are examples of compressed closed circuit circularly polarized omni-directional antennas and methods of fabricating such antennas. In one aspect, which may include at least a portion of the subject matter of any of the preceding and/or following examples and aspects, an antenna comprises a plurality of conductive elements are curved or bent around the center. The number of individual elements in the plurality of conductive elements may be between 2 and 8 elements. Each element in the plurality of conductive elements is a closed loop where the element is electrically connected on both ends.

Each element in the plurality of conductive elements is tilted from horizontal. This tilt angle varies depending on the number of elements and the distance of each element to the center of the antenna. The elements are tilted upward to the right for a right-hand circularly polarized (RHCP) pattern or upward to the left for a left-hand circularly polarized pattern when viewing the antenna from the side. This tilt angle may be between 5 and 52 degrees from horizontal.

The antenna further comprises a feedline system which is electrically connected to each element in the plurality of conductive elements. In certain embodiments, this feedline system is a printed circuit board (PCB).

The antenna further comprises a cable connecting to the feedline system. The cable may be aligned with a center axis of the antenna. In some embodiments, the cable is a coaxial cable. The second end of the cable may include a coaxial radio frequency (RF) connector.

In various embodiments, the antenna is made from stamped metal such as copper or brass which comprises the plurality of conductive elements and the feedline system. In other embodiments, the feedline system and the plurality of conductive elements are made from a stamped or laser cut metal sheet in which the plurality of conductive elements is bent upward from the feedline system and then electrically bonded to a ground plane such as a copper disc.

In another aspect, which may include at least a portion of the subject matter of any of the preceding and/or following examples and aspects, a method for constructing an antenna is provided. A cable is inserted into multi-element feed system on a printed circuit board (PCB). The center conductor of the cable is electrically bonded to one side of the PCB and the shield of the cable is electrically bonded to the opposite side of the PCB. The plurality of conductive elements is installed onto the edges of the multi-element feed system. One end of each element in the plurality of conductive elements is electrically bonded to a trace in the multi-element feed PCB. The opposite end of each element is electrically bonded to the opposite side of the PCB.

Other implementations of this disclosure include corresponding devices, systems, and computer programs, configured to perform the actions of the described method. For instance, a system is provided comprising a receiver and an antenna as previously described. In some embodiments, the antenna is coupled to the receiver via a coaxial radio frequency (RF) connector that is coupled to the second end of the cable. In some embodiments, the antenna is directly coupled to a circuit board of a receiver or transmitter. These other implementations may each optionally include one or more of the following features.

DETAILED DESCRIPTION OF EXAMPLE EMBODIMENTS

Figure 1A:
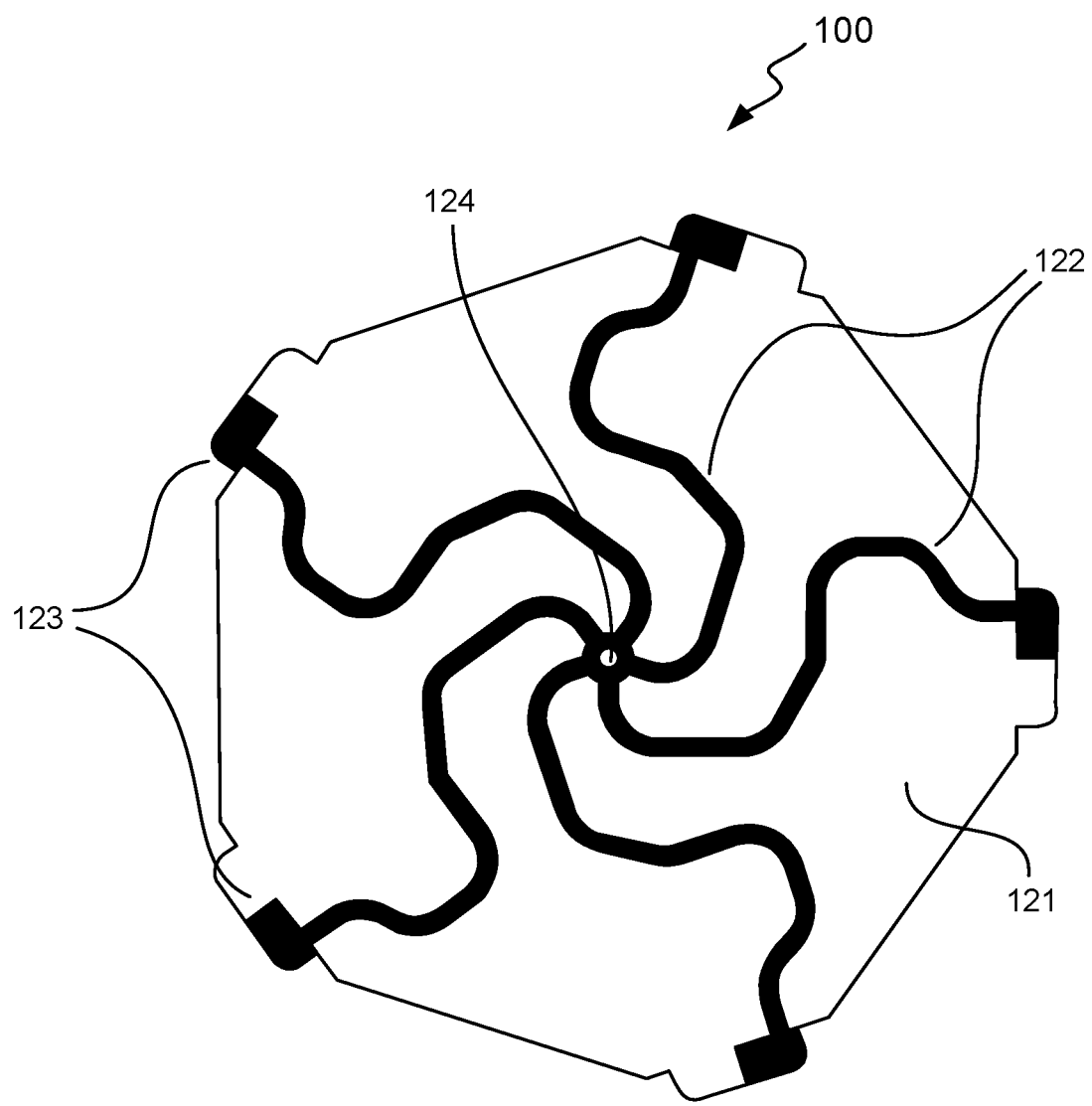
FIGS. 1A, 1B, 1C, 1D and 1E are perspective views of an example multi-element feed system in accordance with one or more embodiments.
Figure 1B:
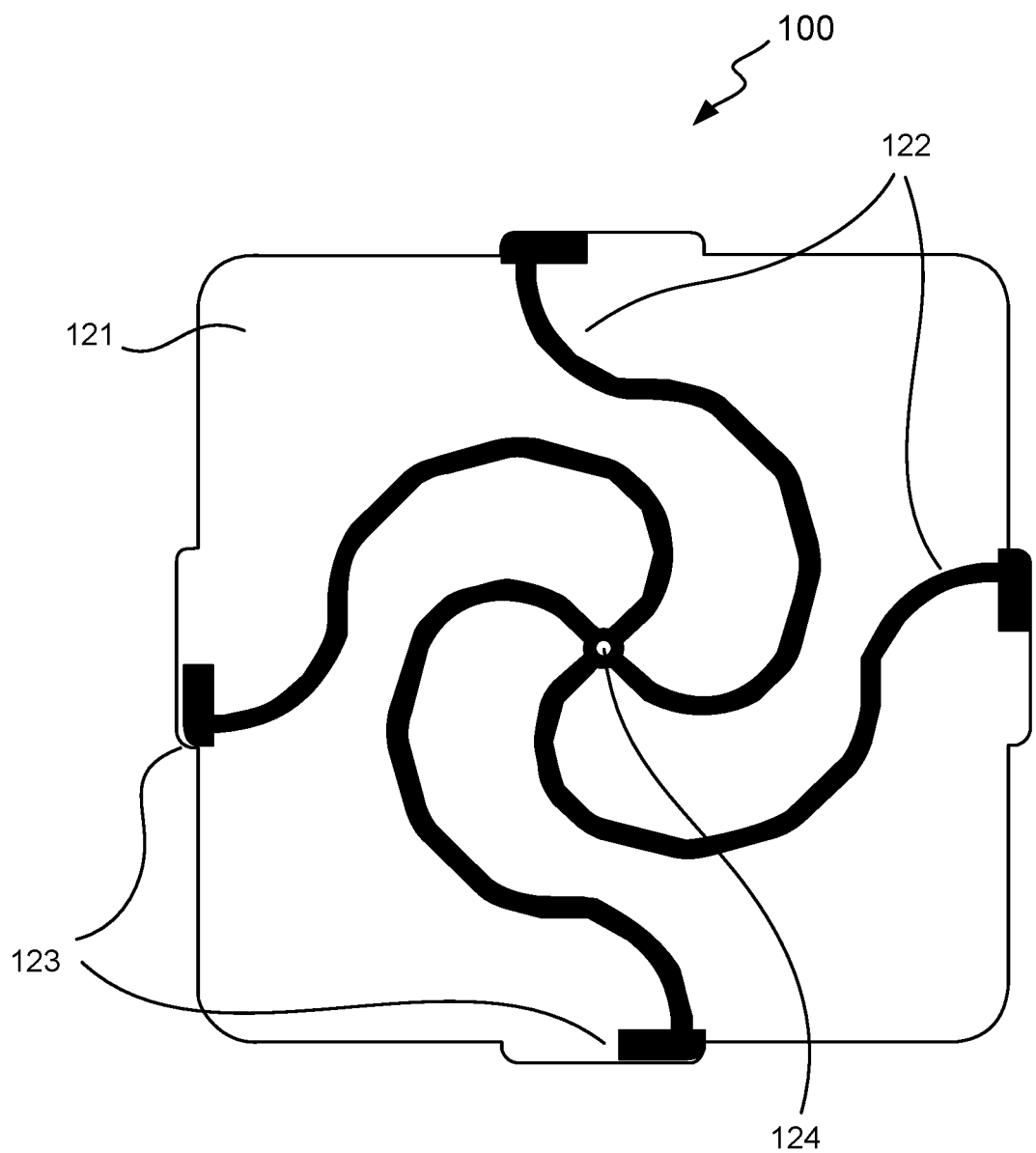
Figure 1C:
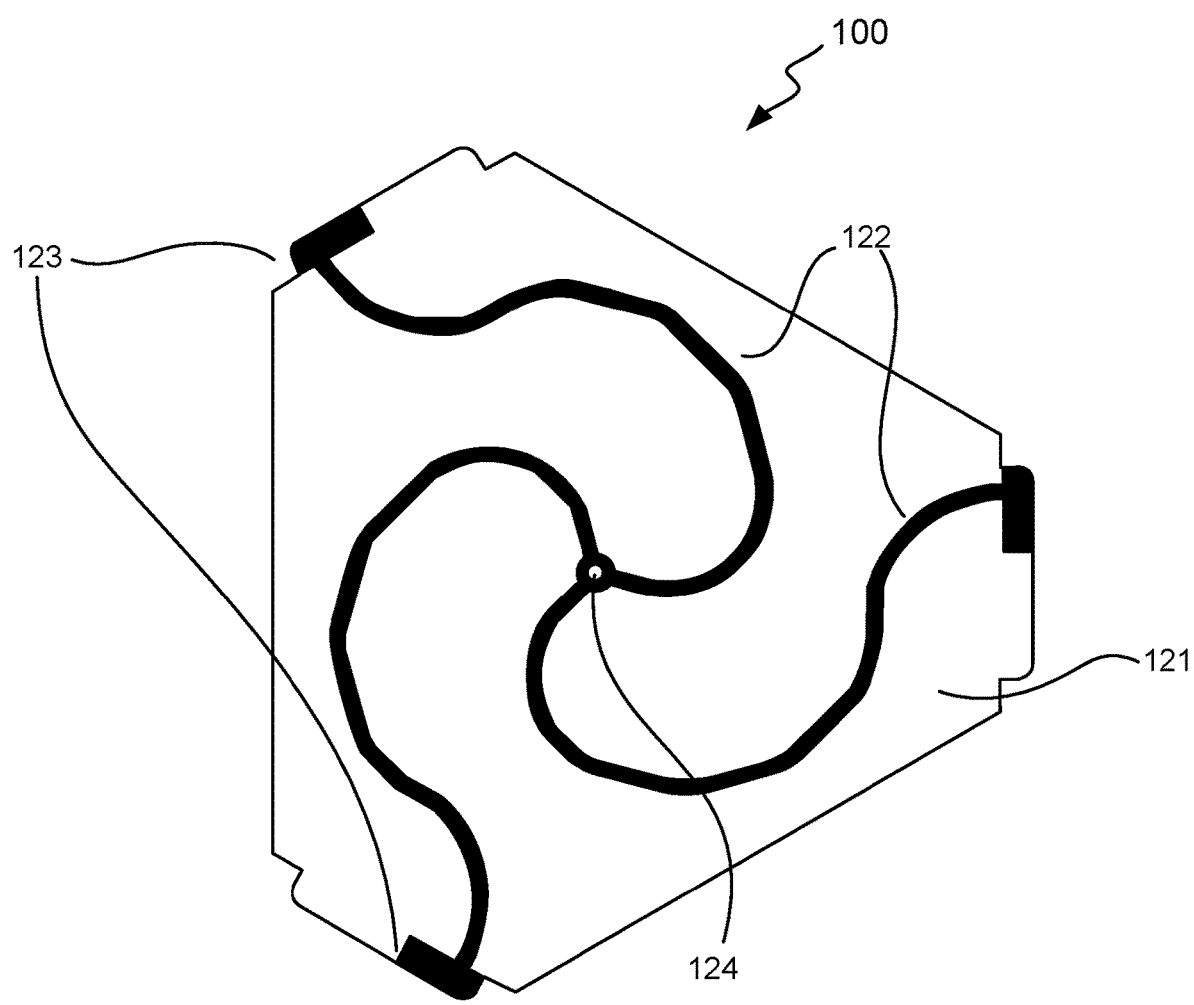
Figure 1D:
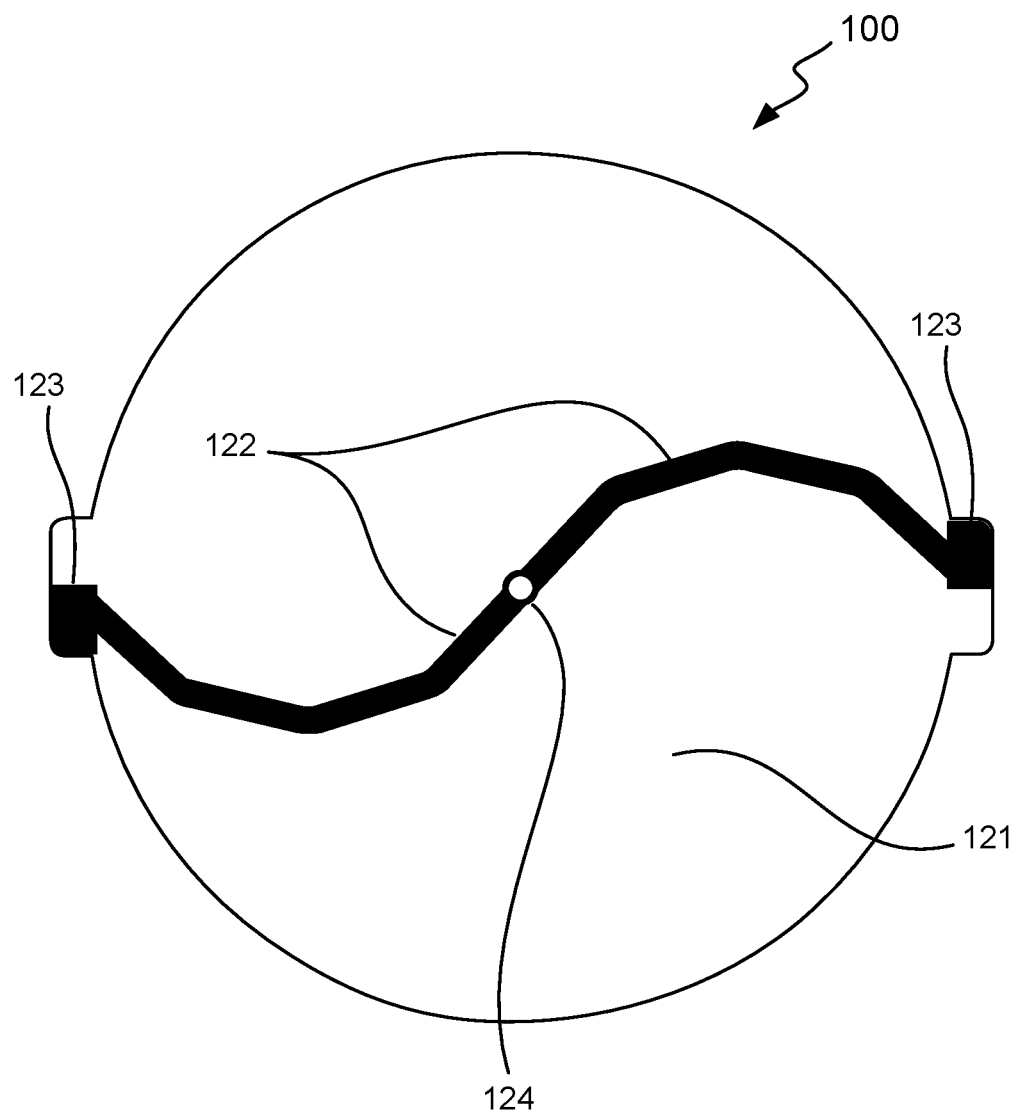

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of particular machines, such as drones. However, it should be noted that the techniques of the present invention apply to a wide variety of different machines that may require remote wireless control. As another example, the techniques of the present invention will be described in the context of particular wireless signals, such as Wi-Fi. However, it should be noted that the techniques of the present invention apply to a wide variety of different wireless signals, including Bluetooth, line of sight transmission mechanisms, beyond line of sight systems, satellite communications, as well as various other networking protocols.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a system uses a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

Various embodiments are provided which describe a circularly polarized omni-directional antenna. Antennas as described herein may be referred to herein as a miniature CLCP (closed loop circularly polarized) antenna. Such antennas may have implementations in a variety of fields, including, but not limited to video piloting, drone vehicles (aircraft and ground, mesh networking, and Wi-Fi applications. In various embodiments, the antenna uses a plurality of conductive elements curved or bent around a central multi-element feed system. Such elements may be wire or printed on a printed circuit board (PCB). The multi-element feed system may be a coaxial cable, PCB, or a combination of both.

In various embodiments, the CLCP antenna uses a PCB microstrip to feed multiple closed loop conductive elements. These elements are bent or curved around the center of the antenna. These elements may be a made of a wire or printed on a PCB (printed circuit board). The entire antenna may be encapsulated with a cover and filled with a dielectric such as expanding foam for protection. Accordingly, various embodiments described in the present disclosure provide a lightweight omni-directional antenna that includes reduced sizing with greater durability and ease of assembly that may be implemented in a variety of systems.

Figure 1E:
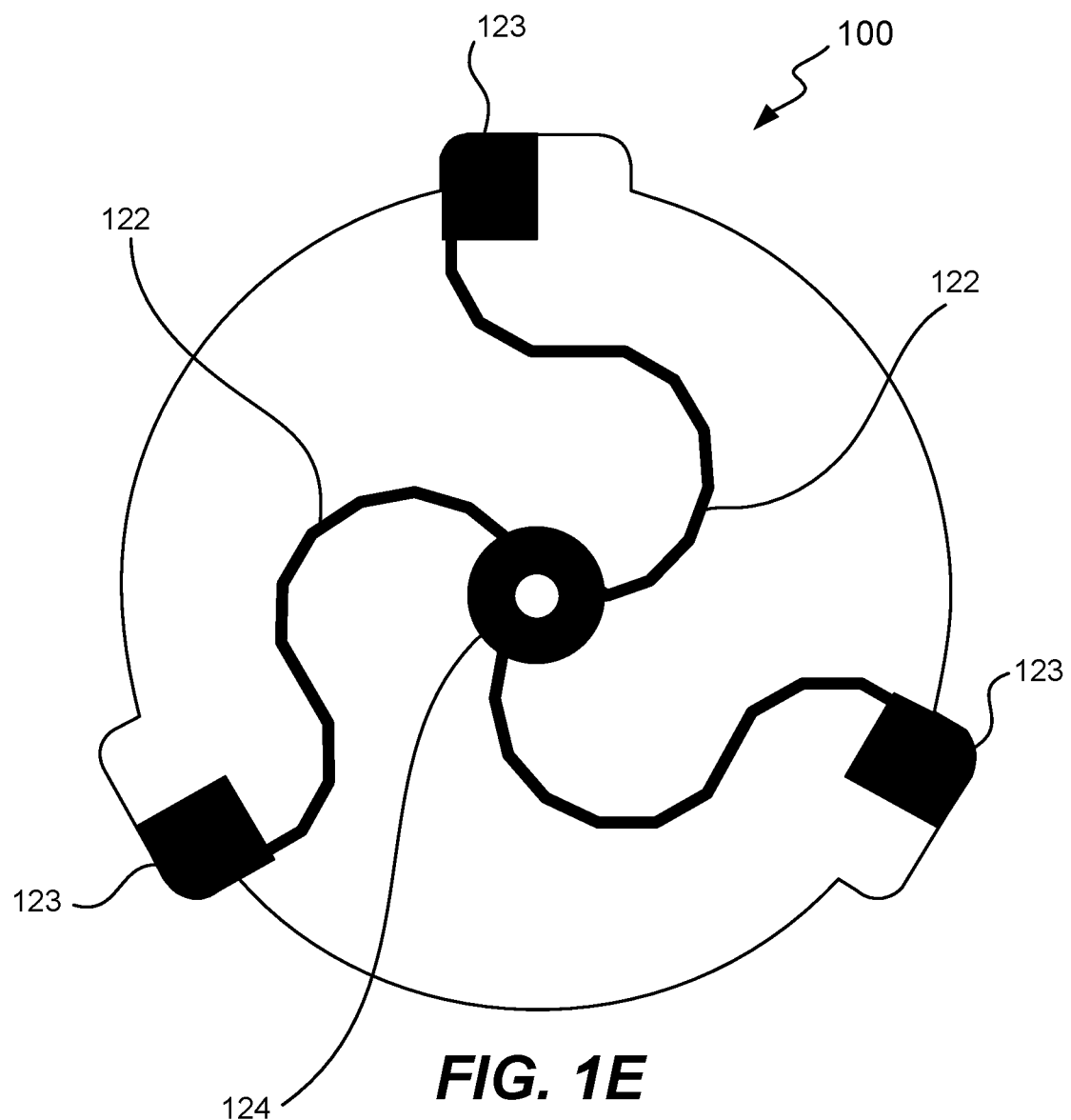

With reference to FIGS. 1A, 1B, 1C, 1D, and 1E shown are perspective views of a multi-element feed system 100 in accordance with one or more embodiments. In various embodiments, the multi-element feed system 100 is comprised of multiple microstrip traces 122 above a ground plane 125. The microstrip traces 122 may connect to exposed soldering pads 123 on the edges of the PCB 121 which are electrically bonded to the plurality of conductive elements 150. For example, FIG. 1E is a printed circuit board layout of a three element version of a compressed closed circuit circularly polarized omni-directional antenna.

Figure 2A:
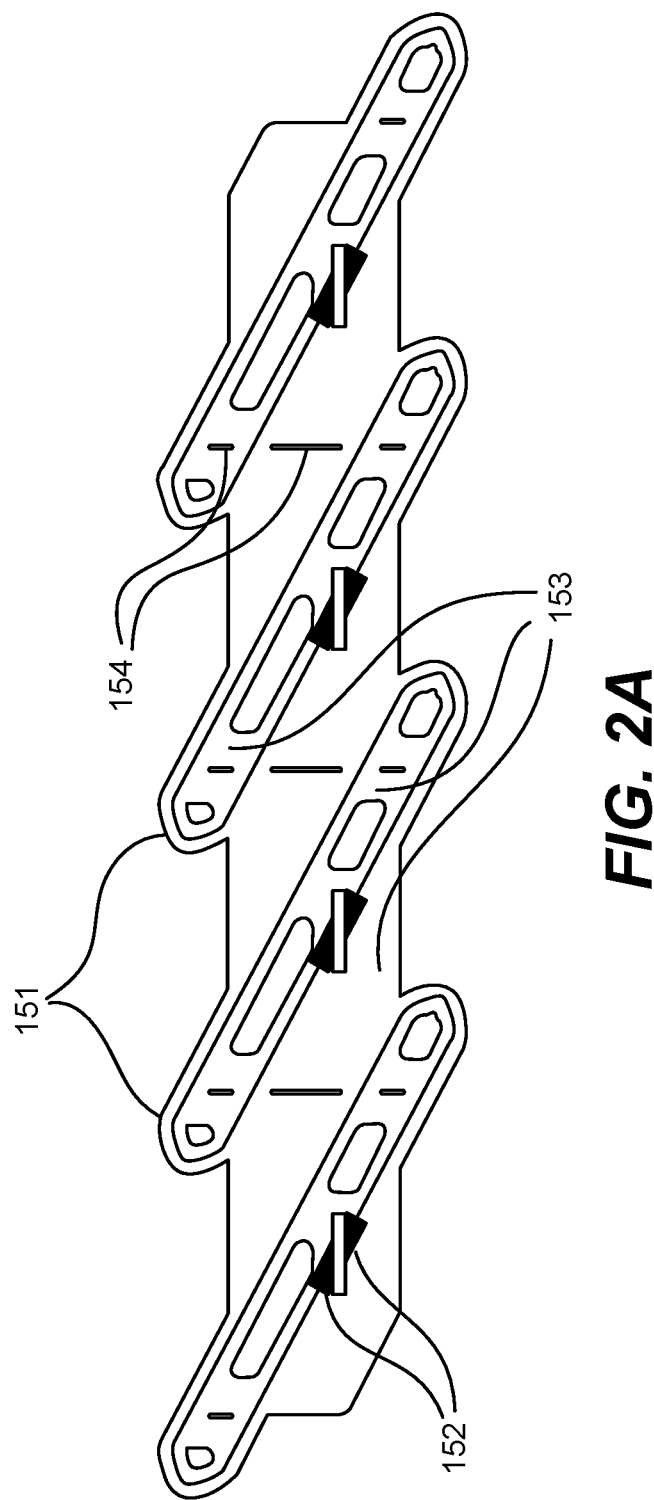
FIGS. 2A, 2B, 2C, and 2D are perspective views of the plurality of conductive elements in accordance with one or more embodiments.
Figure 2B:
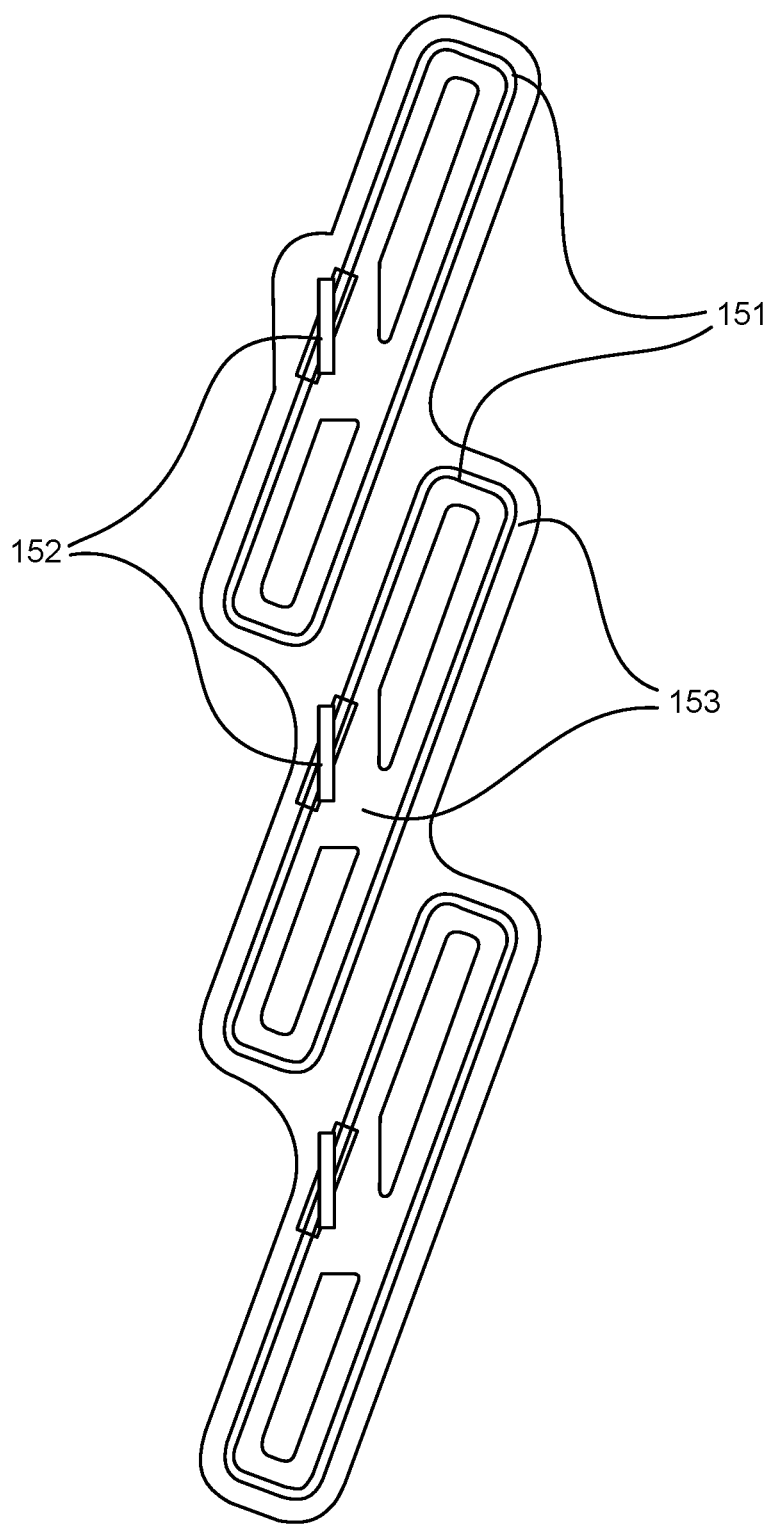
Figure 2C:
Figure 2D:
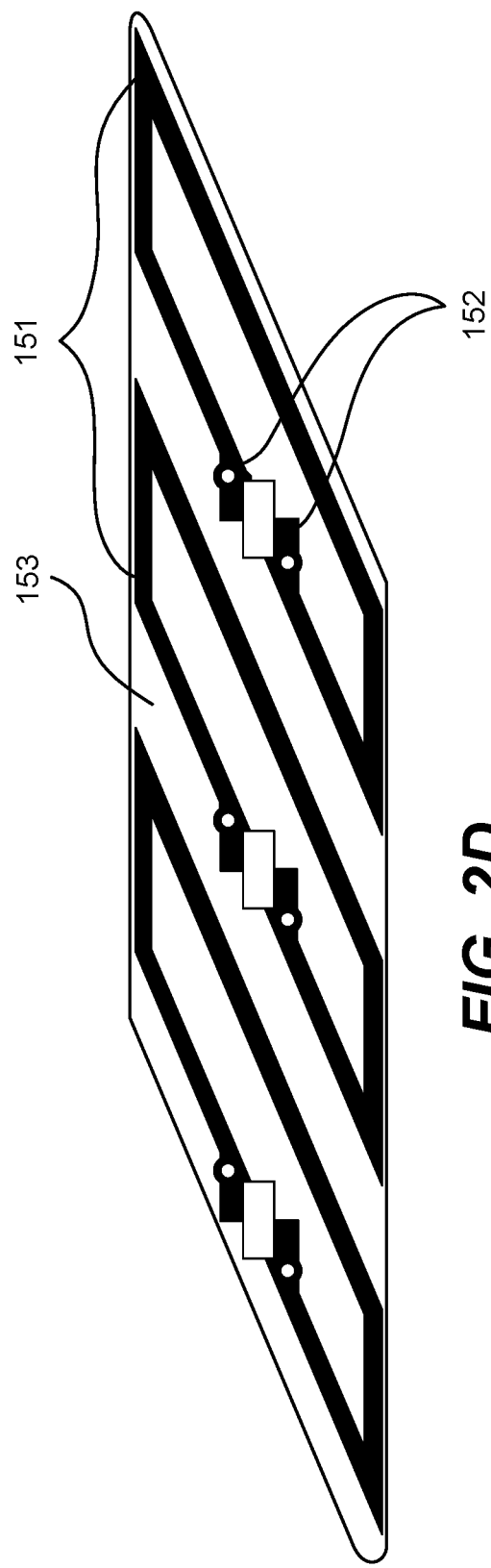

FIG. 2D is the corresponding antenna PCB layout for the 3 element version of the antenna.

In some embodiments the multi-element feed system 120 is comprised of multiple microstrip traces 122 within a printed circuit board 121 (PCB). The microstrip traces 122 may be straight or curved and may change width to achieve the desired electrical characteristics. The PCB 121 may be a multiple layer board made from FR4 or from a flexible PCB with the microstrip traces 122 on one side and a conductive ground plane 125 on the opposite side. The conductive ground plane 125 may cover the entire side of the PCB or may only cover a portion of the PCB. A hole 124 may be drilled in the center of the PCB 121 to pass a portion of cable 201 through.

With reference to FIGS. 2A, 2B, 2C, and 2D shown is a perspective view of the plurality of conductive elements in accordance with one or more embodiments. In various embodiments, the plurality of conductive elements is comprised of a printed circuit board (PCB) 153 with individual conductive elements 151 printed on one side of the PCB 153. In various embodiments the PCB 153 in the plurality of conductive elements is made from FR4. In other embodiments the PCB 153 in the plurality of conductive elements is made from a flexible PCB.

In various embodiments, each end of the individual conductive elements 151 may be terminated by an exposed soldering pad 152. The plurality of conductive elements may also contain stress relief points 154 where the plurality of conductive elements may be bent at a sharp angle to fit within an angular cover. In various embodiments, there are no stress relief points 154 within the PCB 153 for structures such as a round or cylindrical antenna.

With reference to FIG. 2C shown is a perspective view of the plurality of conductive elements 200 without stress relief points 154. In various embodiments, each end of the individual conductive elements 151 may be terminated by an exposed soldering pad 152 which may be located on one or both sides of the PCB 153.

With reference to FIGS. 3A, 3B, 3C and 3D, shown are perspective views of an example assembled CLCP omni-directional antenna 300, in accordance with one or more embodiments. In various embodiments, antenna 300 includes a multi-element feed system 100 which connects a cable 201 with the plurality of conductive elements. Each element in the plurality of conductive elements 200 is fed by a microstrip trace 122 in the multi-element feed system 100.

In various embodiments the exposed soldering pads 152 of the multielement feed system 100 are bonded to the exposed soldering pads 123 on the plurality of conductive elements. The soldering pads 123 on the plurality of conductive elements may be bonded on one or both sides of the PCB 121.

In various embodiments, cable 201 comprises a coaxial cable, such as an RG142 coaxial cable, for example. In other embodiments, cable 201 may comprise any other type of cable with the appropriate electromagnetic characteristics. In some embodiments, the cable may include a characteristic impedance between 25 and 200 Ohms. Such other cables may include an RG402 coaxial cable. In various embodiments, cable 102 may include several layers. The outermost layer may be a jacket, such as a 4.95 mm PTFE jacket. The next layer may be an outer conductor or shield, such as a 4 mm layer of copper plated steel or silver coated copper clad steel. The next layer may be an insulation layer, such as a 2.95 mm layer of solid extruded PTFE. The innermost layer may be an inner conductor, such as a 0.8 mm silver plated copper wire. In various embodiments, cable 102 may comprise a combination of one or more of the aforementioned layers.

The second end of cable 201 may be coupled to a coaxial radiofrequency (RF) connector 203. For example, coaxial RF connector 203 may be a SubMiniature version A (SMA) connector. As another example, coaxial RF connector 203 may be an MMCX connector, or any other suitable miniature RF connector for high-frequency signals. In some embodiments, coaxial RF connector 203 may be an integral part of cable 201. In various embodiments, various types of connectors 203 may be implemented to electrically connect antenna 300 with a circuit board of a transceiver or other device. In some embodiments, cable 201 may be directly coupled to a circuit board without using a connector 203. For example, second end of cable 201 may be directly soldered to a circuit board of a transmitter.

In various embodiments, the frequency of operation (f) of antenna 100 may depend on the length of the conductive elements 151 as well as the placement of the plurality of conductive elements. For example, for a given arrangement of components, the length of each conductive element 151 in inches may be approximated by the following equation:

Where f is the desired frequency in GHz. The radiation pattern may also depend on the distance of the conductive elements 151 from the center of the antenna. The equations above may be approximations and may include a margins of error. For example, the frequency measurements based on the length of the element may vary by +/−68%.

Figure 3A:
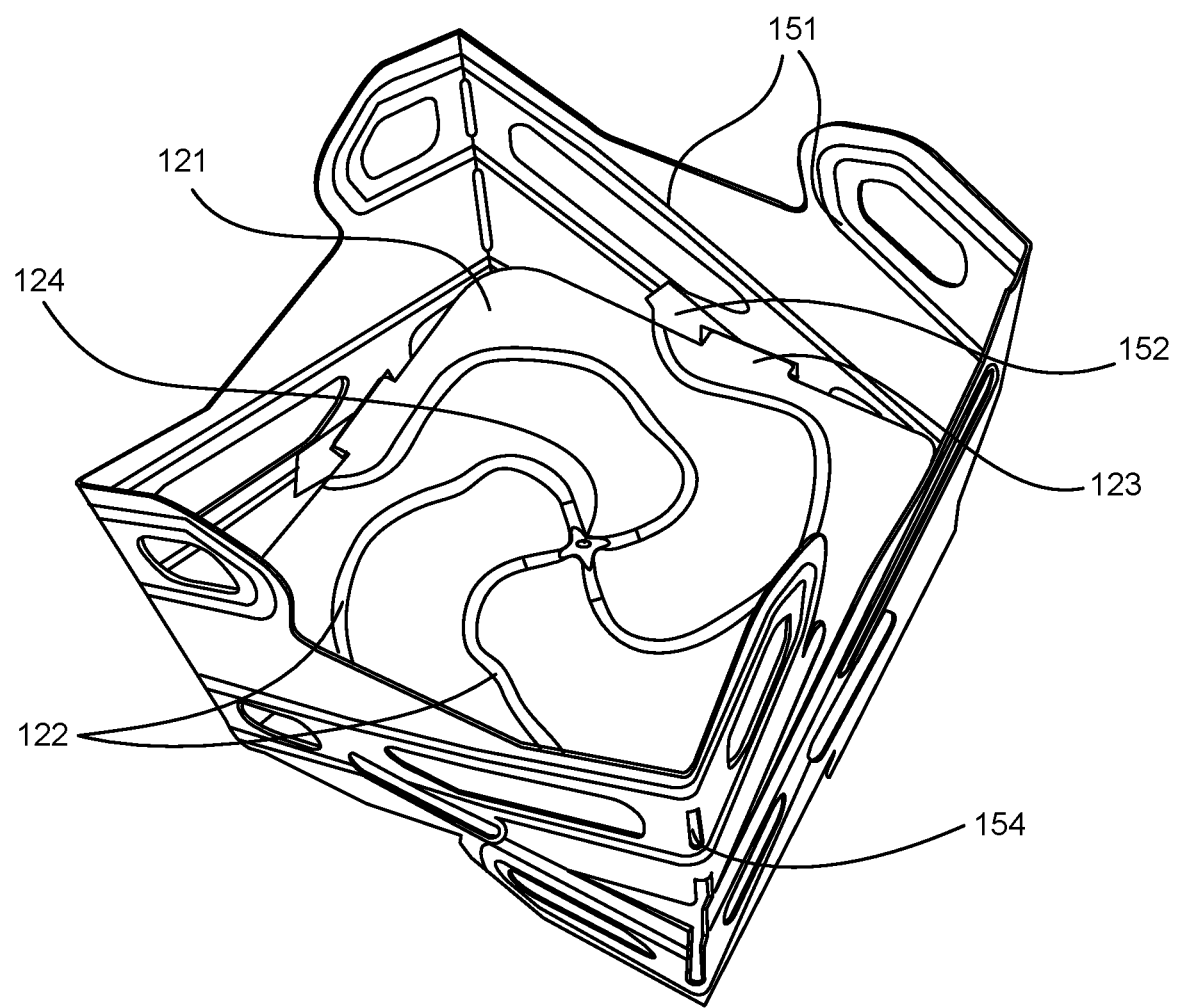
FIGS. 3A, 3B, 3C, and 3D are perspective views of an assembled compressed closed circuit closed loop (CLCP) antenna in accordance with one or more embodiments.
Figure 3B:
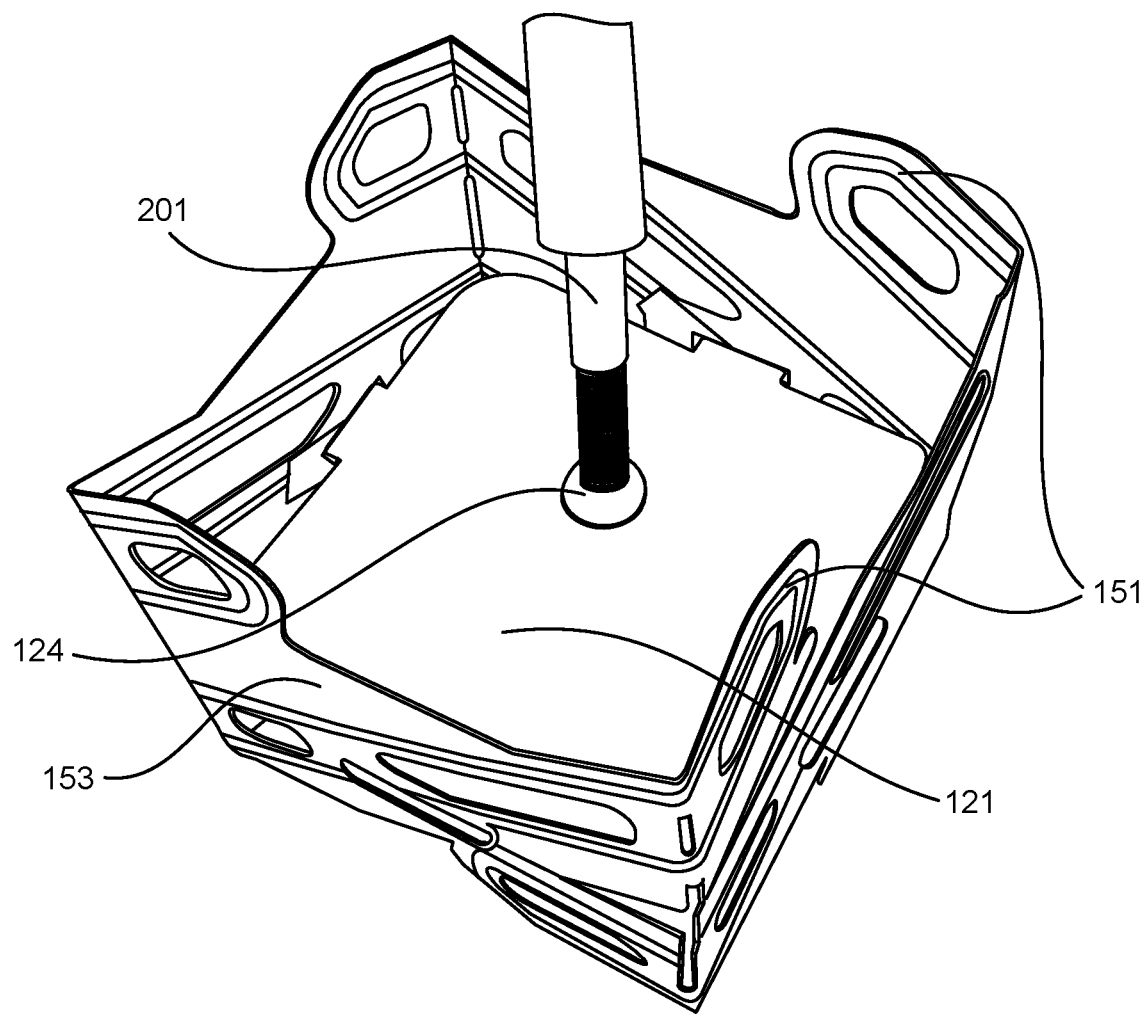

With reference to FIGS. 3A and 3B in some embodiments, the distance from the center of each conductive element 151 in the plurality of conductive elements 150 to the center of the antenna may be approximated by the equation:

where ri is the distance in inches from the center of each conductive element to the center of the antenna and f is the frequency in GHz. This distance may vary by as much as +/−54%.

Figure 3C:
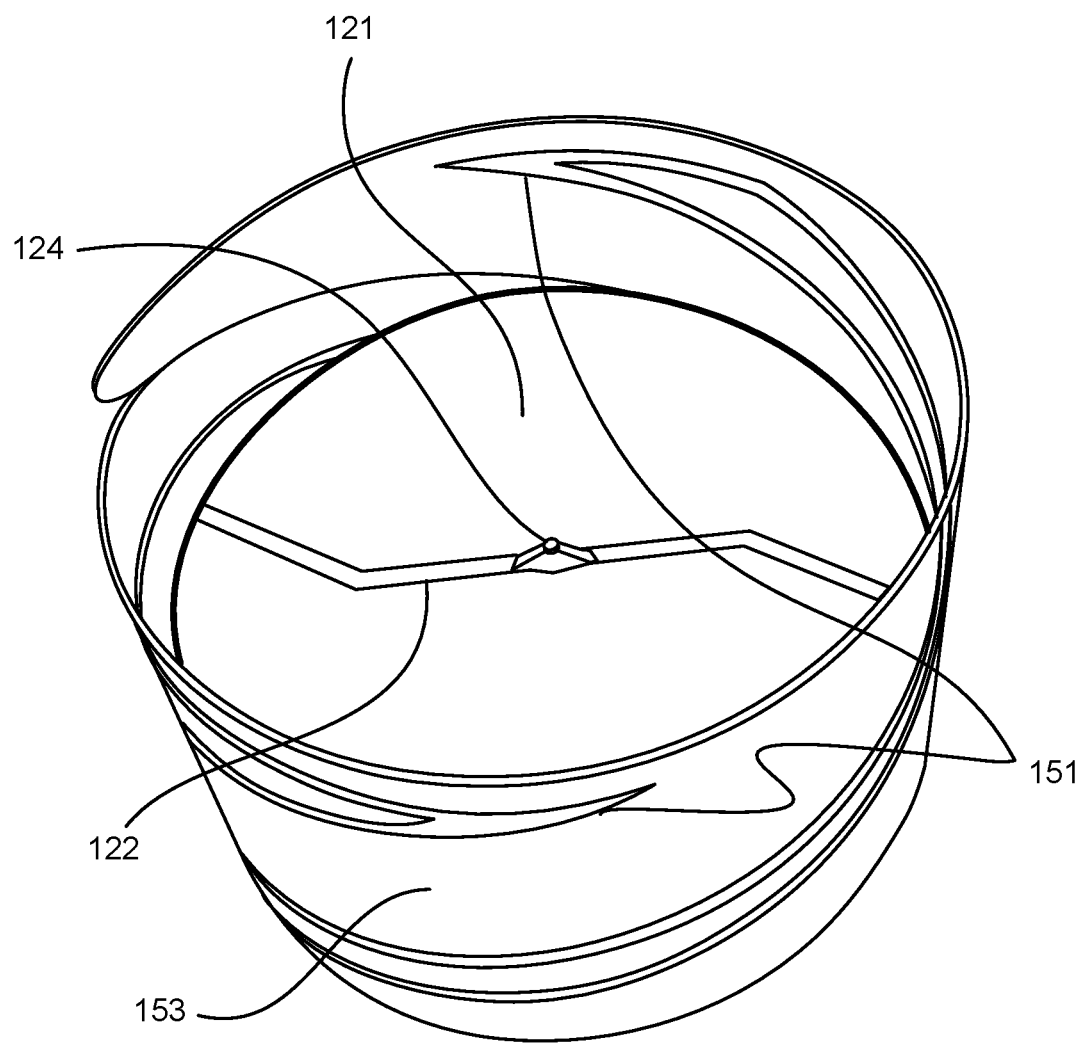
Figure 3D:
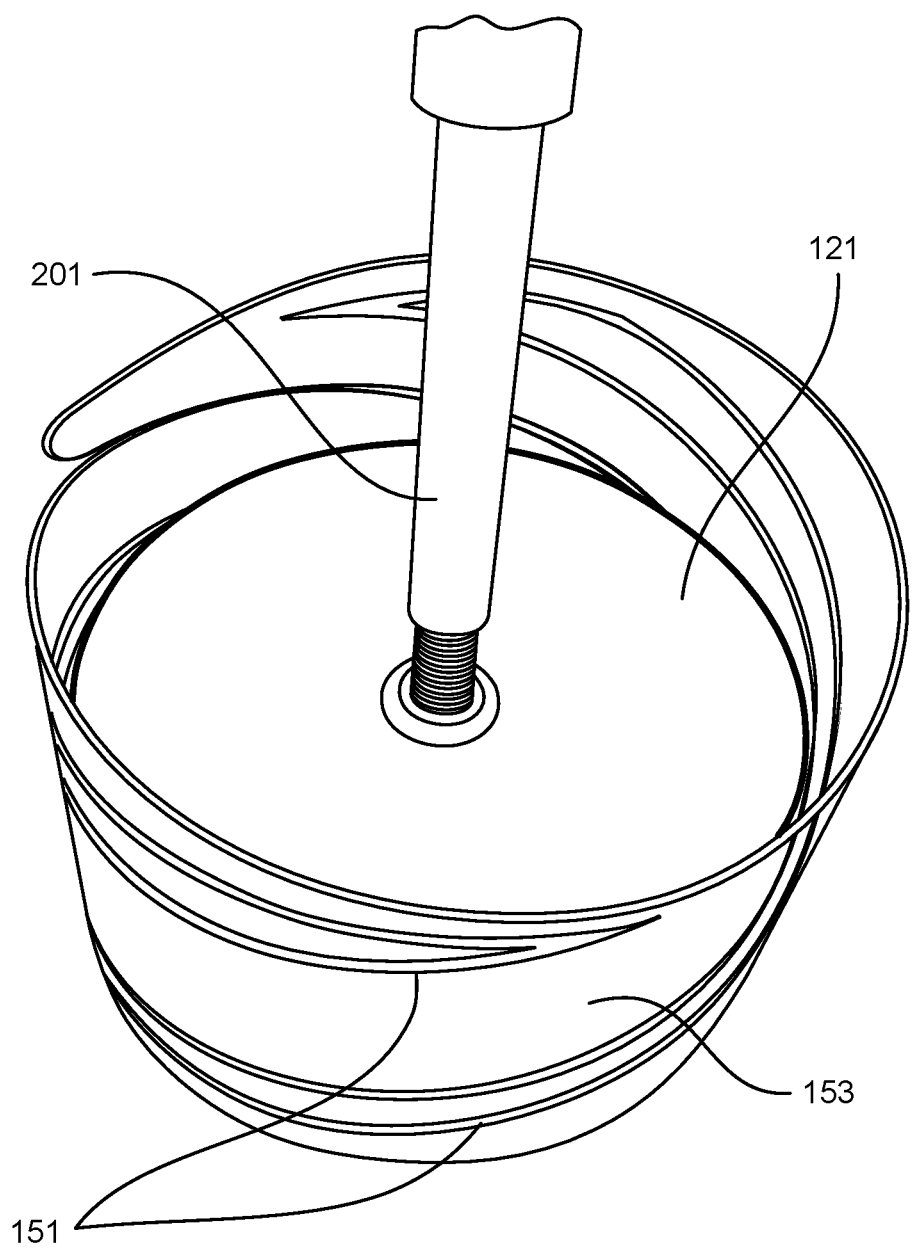

With reference to FIGS. 3C and 3D in some embodiments, the distance from the center of each conductive element 151 in the plurality of conductive elements 150 to the center of the antenna may be approximated by the equation:

where ri is the distance in inches from the center of each conductive element to the center of the antenna and f is the frequency in GHz. This distance may vary by as much as −41% to +105% depending on the desired characteristics of the antenna.

Figure 4:
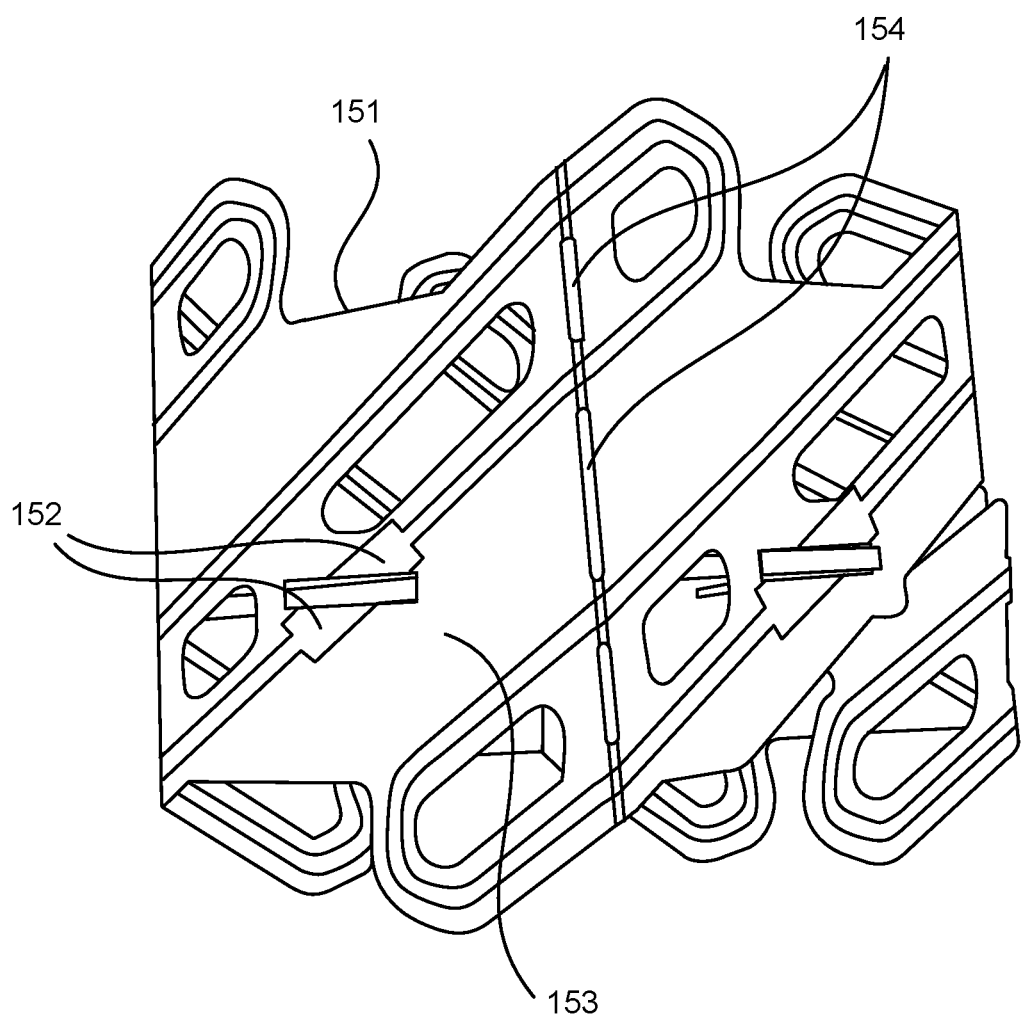
FIG. 4 is an example of a single element within the plurality of conductive elements comprised of a metallic wire.

With reference to FIG. 4, show is an example single element 151 wherein the element 151 is a copper wire. In various embodiments the single element 151 is an uninsulated bare copper wire. In specific embodiments, the single element is covered partially by insulation. In specific embodiments the insulation is removed to exposed a soldering pad 152 in the element 151.

Figure 5:
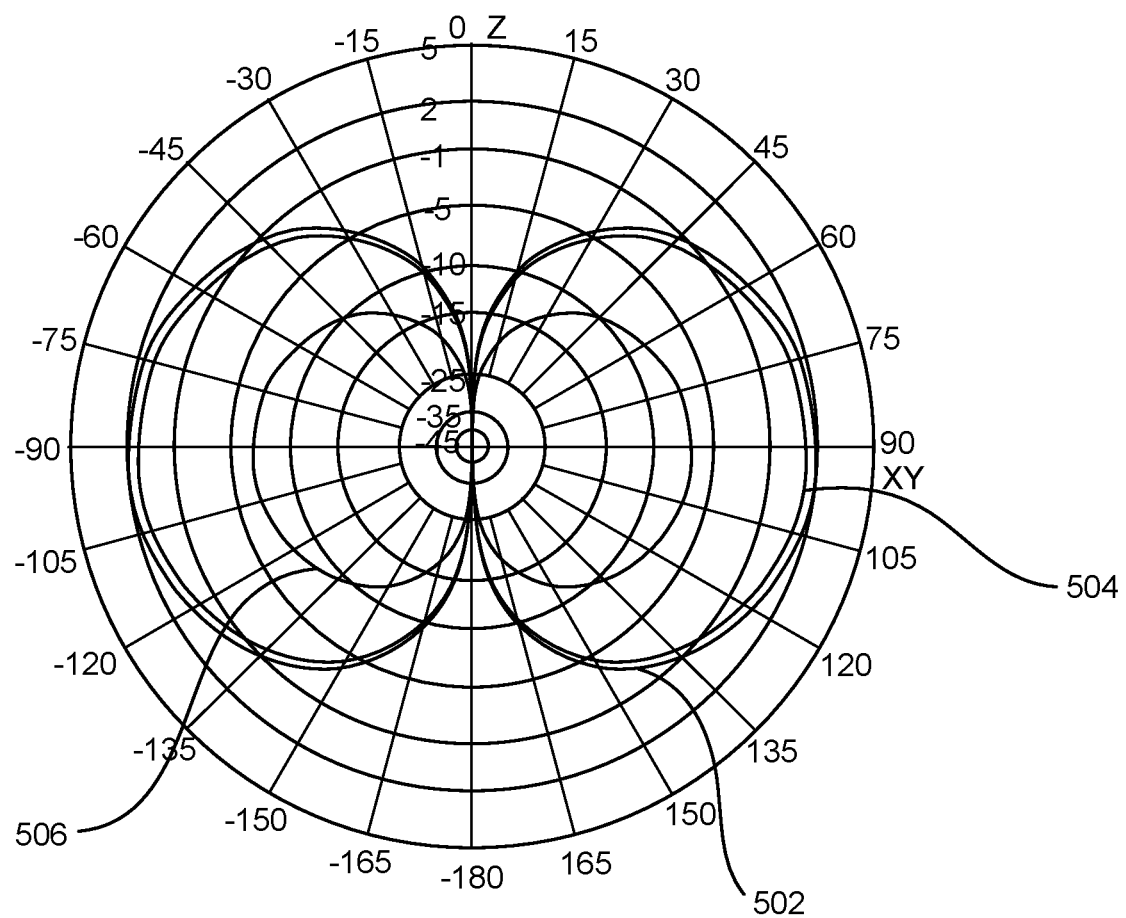
FIG. 5 is an example radiation pattern graph of an omni-directional antenna in accordance with one or more embodiments.

FIG. 5 is an example radiation pattern graph 500 of an omni-directional antenna, in accordance with one or more embodiments. The graph shows radiation pattern of an example of a right hand circular polarization configuration of antenna 100. The graph shows the total gain 502 (outermost pattern), dominant rotation pattern 504 (middle pattern), and recessive pattern 506 (innermost pattern). The plurality of conductive elements may be reversed in direction to change the recessive and dominant antenna patterns from RHCP to LHCP and LHCP to RHCP. Additionally, the location of the plurality of conductive elements will change the pattern of the antenna.

Figure 6:
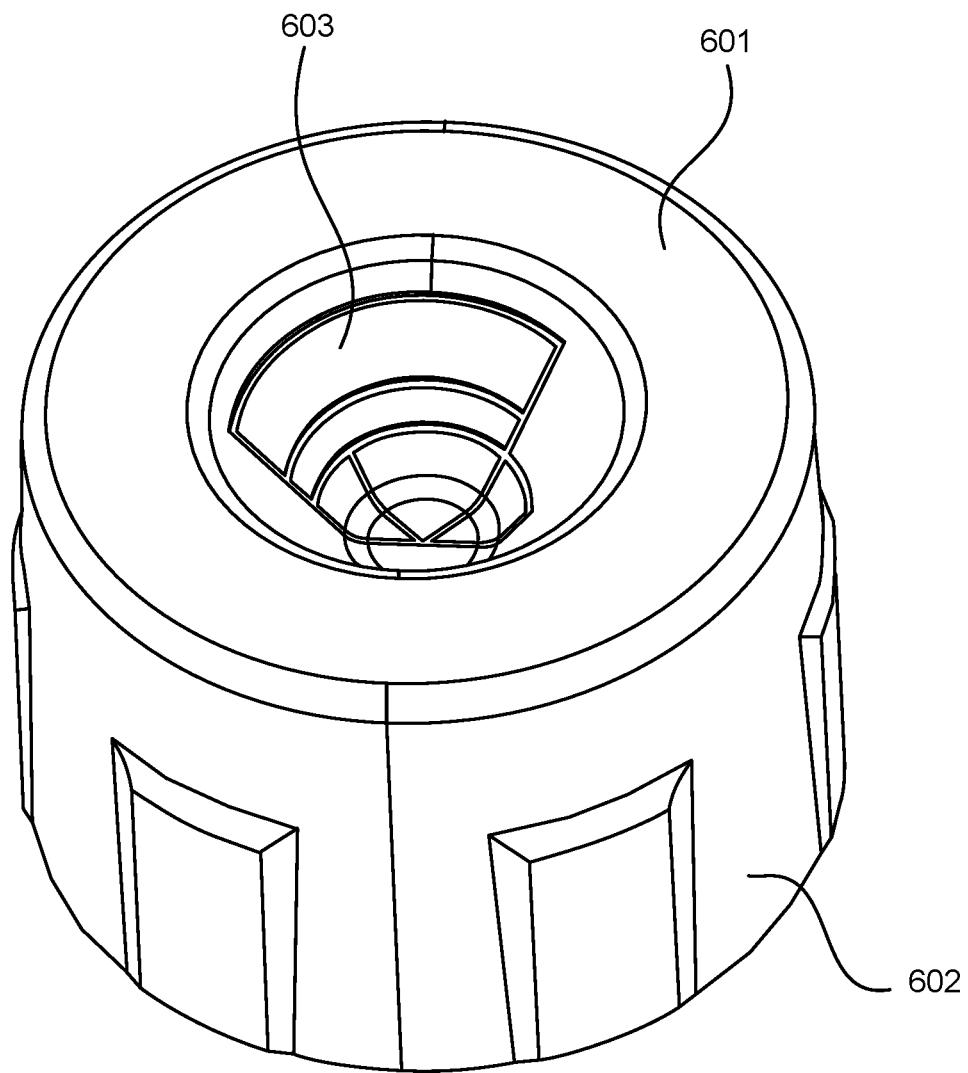
FIG. 6 is an example of a non-conductive protective cover in accordance with one or more embodiments.

FIG. 6 is an example non-conductive protective cover 600 in accordance with one or more embodiments. The cover comprises a top portion 601 and a bottom portion 602. The bottom portion may contain a hole for the cable to extend through. This hole may be in the bottom of the lower portion 602 or may be in the side of the upper portion 601. The cover may be filled with protective foam 603 such as polyurethane expanding foam.

Figure 7:
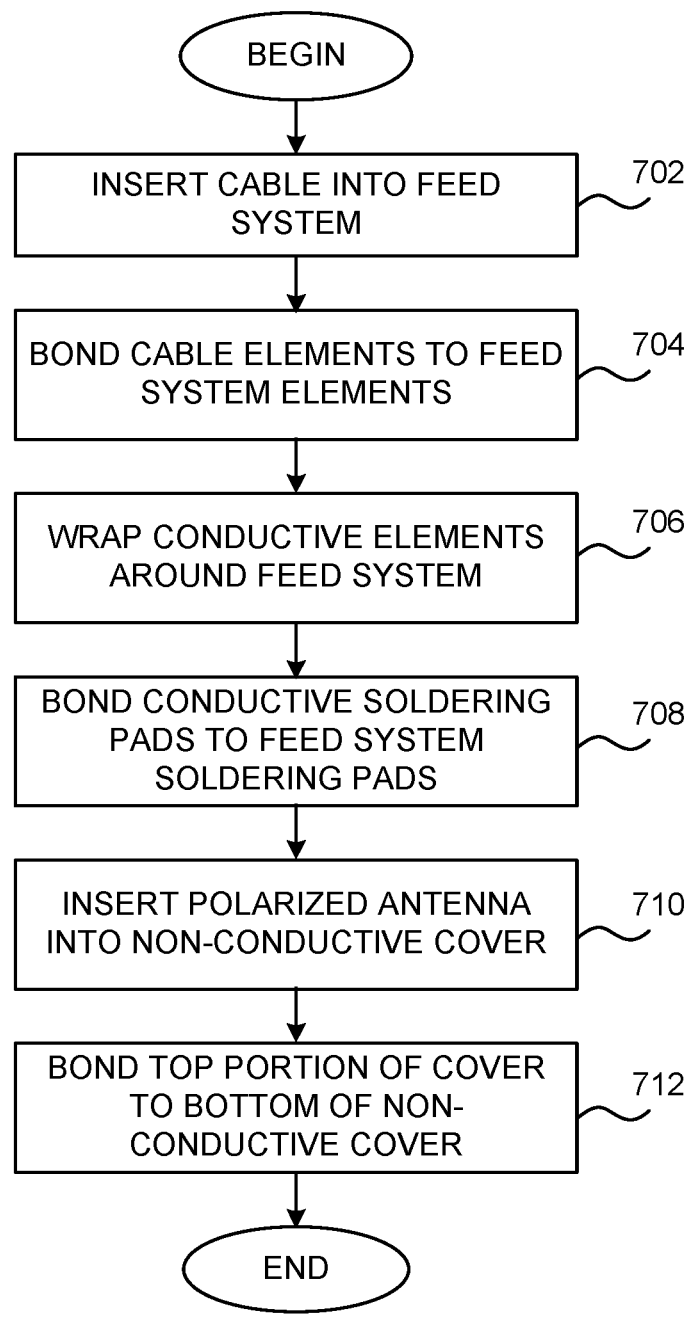
FIG. 7 is a flow diagram of a method of constructing an omni-directional antenna in accordance with one or more embodiments.

FIG. 7 is a flow diagram of a method of assembling a closed-circuit circularly polarized antenna omni-directional antenna in accordance with one or more embodiments. At step 702 a cable 201 is inserted through the bottom cover 602 and into the multi-element feed system 100. At step 704 the center element of the cable 201 is electrically bonded to the microstrip traces 122 and the shield of the cable 201 is electrically bonded to the ground plane 125. At step 706, the plurality of conductive elements 200 is bent around the multi-element feed system 100. At step 708 each solder pad 152 of each element in the plurality of conductive elements 200 is electrically bonded via the exposed solder pads 152 to the solder pads 123 of the multi-element feed system 100. At step 710, the CLCP antenna is bent and pressed inside of the top portion 601 of the non-conductive cover 600. At step 712, the top cover portion 601 is bonded to the lower cover portion 602 encapsulating the plurality of conductive elements 200 and the multi-element feed system 100 into an assembled CLCP antenna 300.

What is claimed is:

1. An antenna comprising:
   a multi-element feed system including a printed circuit board (PCB);
   a top layer containing microstrip traces;
   a base layer comprising a ground plane;
   solder pads; and
   a plurality of conductive continuous symmetrical elements having wires or traces printed on the PCB positioned radially around the center of the antenna which are electrically bonded to each side of the multi-element feed system,
   wherein the plurality of conductive continuous symmetrical elements is a closed circuit with both end points terminated at a feed system; and
   wherein the plurality of conductive continuous symmetrical elements is bent or curved around the center of the antenna, and
   wherein the plurality of conductive continuous symmetrical elements contain between 2 and 8 individual conductive continuous symmetrical conductors;
   a non-conductive protective cover filled with insulating foam; and
   one of a cable and feedline.

2. The antenna of claim 1 wherein the plurality of conductive continuous symmetrical elements is curved about the circumference around the center axis of the cover.

3. The antenna of claim 1 wherein the plurality of conductive continuous symmetrical elements is bent at sharp angles around the center of the antenna.

4. The antenna of claim 1 wherein each conductive continuous symmetrical element of the plurality of conductive continuous symmetrical elements is configured to include an angle of tilt between 5 degrees and 52 degrees from horizontal.

5. The antenna of claim 1 wherein each wire element of the plurality of conductive continuous symmetrical elements is configured to include an angle of tilt of 23 degrees from horizontal.

6. The antenna of claim 1 wherein each wire element of the plurality of conductive continuous symmetrical elements is configured to include an angle of tilt of 15 degrees from horizontal.

7. The antenna of claim 1 wherein the plurality of conductive continuous symmetrical elements is included within a printed circuit board, the printed circuit board wrapped around the circumference of the multi-element feed system.

8. The antenna of claim 1 wherein a second end of the cable includes a coaxial radio frequency (RF) connector.

9. The antenna of claim 1 wherein the plurality of conductive continuous symmetrical elements is covered by a non-conductive cover.

10. The antenna of claim 1 wherein the antenna cover is filled with expanding foam.

11. An antenna comprising:
    a multi-element feed system including a printed circuit board,
    a top layer containing microstrip traces,
    a base layer comprising a ground plane,
    solder pads; and
    a plurality of conductive continuous symmetrical elements wherein each conductive continuous symmetrical elements is positioned radially around the center of the antenna which are electrically bonded to each side of the multi-element feed system;
    is one of exposed wires and printed on a PCB; and
    wherein the plurality of conductive continuous symmetrical elements is a closed circuit with end points terminating at a feed system; and
    wherein the plurality of conductive continuous symmetrical elements is bent at sharp angles around corners, have three or more flat sides; and contains between three and eight individual conductors.

12. The antenna of claim 11 wherein the angle of the elements is 30 degrees.

* * * * *